United States Patent [19]
Uzoh

[11] Patent Number: 6,071,388
[45] Date of Patent: *Jun. 6, 2000

[54] ELECTROPLATING WORKPIECE FIXTURE HAVING LIQUID GAP SPACER

[75] Inventor: Cyprian E. Uzoh, Hopewell Junction, N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/086,693

[22] Filed: May 29, 1998

[51] Int. Cl.⁷ .................................................. C25D 17/04
[52] U.S. Cl. ........................... 204/297 R; 204/297 W; 204/286; 204/287; 204/224 R
[58] Field of Search ............................ 204/297 R, 297 W, 204/287, 286, 224 R; 205/652, 653, 654

[56] References Cited

U.S. PATENT DOCUMENTS

| | | | |
|---|---|---|---|
| 3,421,994 | 1/1969 | Leduc | 204/219 |
| 3,511,758 | 5/1970 | Bedi et al. | 204/15 |
| 4,302,316 | 11/1981 | Nester | 204/224 |
| 4,532,017 | 7/1985 | Keinborg et al. | 204/67 |
| 4,626,331 | 12/1986 | Goto et al. | 204/222 |
| 4,793,895 | 12/1988 | Kaanta et al. | 156/627 |
| 4,821,466 | 4/1989 | Kato et al. | 51/317 |
| 4,861,449 | 8/1989 | Onge | 204/197 |
| 4,934,102 | 6/1990 | Leach et al. | 51/50 R |
| 5,078,801 | 1/1992 | Malik | 134/29 |
| 5,167,792 | 12/1992 | Komitokahara et al. | 204/297 R |
| 5,168,887 | 12/1992 | Thompson et al. | 134/153 |
| 5,225,034 | 7/1993 | Yu et al. | 156/636 |
| 5,240,552 | 8/1993 | Yu et al. | 156/636 |
| 5,449,313 | 9/1995 | Kordonsky et al. | 451/35 |
| 5,464,519 | 11/1995 | Tomba et al. | 204/280 |
| 5,492,594 | 2/1996 | Burke et al. | 216/86 |
| 5,516,412 | 5/1996 | Andricacos et al. | 204/224 R |
| 5,522,975 | 6/1996 | Andricacos et al. | 204/297 |
| 5,534,106 | 7/1996 | Cote et al. | 156/636.1 |
| 5,543,032 | 8/1996 | Datta et al. | 205/670 |
| 5,567,300 | 10/1996 | Datta et al. | 205/652 |
| 5,575,706 | 11/1996 | Tsai et al. | 451/41 |
| 5,620,581 | 4/1997 | Ang | 204/297 R |
| 5,624,300 | 4/1997 | Kishii et al. | 451/36 |
| 5,637,185 | 6/1997 | Murarka et al. | 438/5 |
| 5,685,766 | 11/1997 | Mattingly et al. | 451/36 |
| 5,744,019 | 4/1998 | Ang | 204/297 R |
| 5,755,859 | 5/1998 | Brusi et al. | 106/1.22 |
| 5,793,272 | 8/1998 | Burghartz et al. | 336/200 |
| 5,807,165 | 9/1998 | Uzoh et al. | 451/41 |

OTHER PUBLICATIONS

Mehdizadeh, et al., Optimization of Electrodeposit Uniformity by the Use of Auxiliary Electrodes, 1990, J. Electrochem. Soc., vol. 137, No. 1.

S. Mehdizadeh, et al, "Optimization of Electrodeposit Uniformity by the Use of Auxiliary Electrodes" Jrl. of Electrochemical Soc., vol. 137, #1, Jan. 1990, pp. 110–117.

U.S. Pat. Pending application Ser. No. 09/406,644 Entitled: Electroplating Workpiece Fixture Having Liquid Gap Spacer by Uzoh.

*Primary Examiner*—Bruce F. Bell
*Attorney, Agent, or Firm*—Joseph P. Abate

[57] ABSTRACT

A fixture for supporting a workpiece during electroplating of a metal upon the workpiece in a conductive electroplating bath includes a non-conductive frame member for receiving the workpiece therein. The fixture further includes a current distribution means having a plurality of contacts. The plurality of contacts is disposed inwardly for providing an equally distributed electrical contact with an outer perimeter region of the workpiece. The workpiece is supported between the frame member and the current distribution means. Lastly, a thief electrode is perimetrically disposed about the workpiece and spaced a prescribed distance from the workpiece by a gap region. During plating of a metal upon the workpiece, the gap region between the thief and the workpiece is filled with the conductive electroplating bath. An electroplating apparatus having a fixture for supporting a workpiece during an electroplating process and a method of supporting the workpiece to be electroplated are also disclosed.

51 Claims, 12 Drawing Sheets

ELECTROPLATING WORKPIECE FIXTURE HAVING LIQUID GAP SPACER

BACKGROUND OF THE INVENTION

1. Field of the Invention

This invention relates generally to a method and apparatus for electroplating and, more particularly, to a method and apparatus for holding a workpiece during electroplating with copper or other metals, for example, electroplating of semiconductor wafers.

2. Discussion of the Related Art

To meet the demands for higher and higher circuit speed in ultra large scale integrated (ULSI) circuit devices, it has become imperative to reduce the size of wiring structures in ULSI devices. For example, with respect to devices in any given dielectric film, as clock frequencies increase and as interconnect ground rules decrease, on-chip resistance-capacitance (RC) time delays increase. The restraints imposed by the increased RC time constants, becomes one of the critical impediments to achieving higher and higher circuit speeds. Moreover, the increasing interconnect current density accompanying the decreasing line and via dimensions is a source of reliability concern, especially in aluminum (Al) based metallurgy, the backbone of present day chip wiring. The incorporation of lower resistivity copper (Cu) and its microalloys in semiconductor chip wiring structures, results in improved chip performances and superior reliability when compared to Al based interconnect metallurgies.

Electrodeposition methods are rapidly emerging as a method of choice for chip metallization in high performance ULSI circuits. This is especially so when copper structures are used for chip wiring. The emergence of copper electrodeposition, as opposed to chemical vapor deposition (CVD) of copper, copper sputtering, and other copper deposition methods has resulted from an evaluation of various copper deposition methods for submicron and deep submicron chip wiring.

Electrodeposition, alternatively referred to as electroplating, is a process for depositing films of metal or alloy on a workpiece article such as various electronic components, for example. In electroplating, the article is placed in a suitable electrolyte bath containing ions of a metal to be deposited. The article forms a cathode which is connected to the negative terminal of a power supply, and a suitable anode is connected to the positive terminal of the power supply. Electrical current flows between the anode and cathode through the electrolyte, and metal is deposited on the article by an electrochemical reaction.

In interconnect metallization schemes, the uniformity of metal distribution on the substrate has been a source of concern. The better the uniformity, the more desirable the process. In electrodeposited film, to achieve a uniform metal deposit on the cathode, the design of the workpiece may require use of an anode or cathode shielding, or the use of auxiliary cathode (known in the art as a "thief" and hereinafter referred to as a thief). A thief is often incorporated around a plating workpiece, either to improve the uniformity of electrodeposited metal on the workpiece or to control the profile of the deposited metal. Generally, the workpiece is disposed in close proximity to the auxiliary electrode during a plating process. To prevent the thief from shorting to the workpiece, a thin insulating spacer, typically on the order of one millimeter (1 mm), is used to isolate the thief from the workpiece. The later arrangement tends to produce the desired metal uniformity on the workpiece or substrate of interest; however, during plating, an undesired buildup of plated metal over the insulating spacer between the thief and the substrate often occurs. Such is the case in the electrodeposition of copper for semiconductor chip wiring and/or interconnection applications. The buildup of plated metal over the thief/substrate insulating spacer undesirably shorts the thief to the workpiece. The bridging of the thief to the workpiece or wafer distorts the desired metal distribution profile on the workpiece or wafer, thus producing a defective part, and further requiring a rework operation.

To correct for the undesired bridging, very periodic inspections of the cathode or cathode assembly for workpiece/thief bridging and replacement of the thief/workpiece assembly are required. Such a periodic replacement of thief/workpiece cathode assembly results in losses due to equipment down time, and the cost/expense of frequent inspection of the thief/wafer isolator for conditions of undesired metal bridging.

It is, thus, desirable to provide a method and apparatus for overcoming the problems associated with the undesired premature bridging between a workpiece and auxiliary electrode during an electroplating process.

SUMMARY OF THE INVENTION

It is a principal object of the present invention to overcome the problems in the art as discussed herein above.

In accordance with the present invention, a fixture for supporting a workpiece during electroplating of a metal upon the workpiece in a conductive electroplating bath includes a non-conductive frame member for receiving the workpiece therein. The fixture further includes a current distribution means having at least a plurality of contacts. The plurality of contacts is disposed inwardly for providing an equally distributed electrical contact with an outer perimeter region of the workpiece. The workpiece is supported between the frame member and the current distribution means. Lastly, a thief electrode is perimetrically disposed about the workpiece and spaced a prescribed distance from the workpiece by a gap region. During plating of a metal upon the workpiece, the gap region between the thief and the workpiece is filled with the conductive electroplating bath.

In accordance with an alternate embodiment of the present invention, a motor provides for rotation of the frame member and the current distribution means in unison about an axis. In the later instance, the thief electrode is held in a stationary position with respect to the frame member and the current distribution means.

An electroplating apparatus having a fixture for supporting a workpiece during an electroplating process and a method of supporting the workpiece to be electroplated are also disclosed.

BRIEF DESCRIPTION OF THE DRAWINGS

The foregoing and other teachings, objects and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
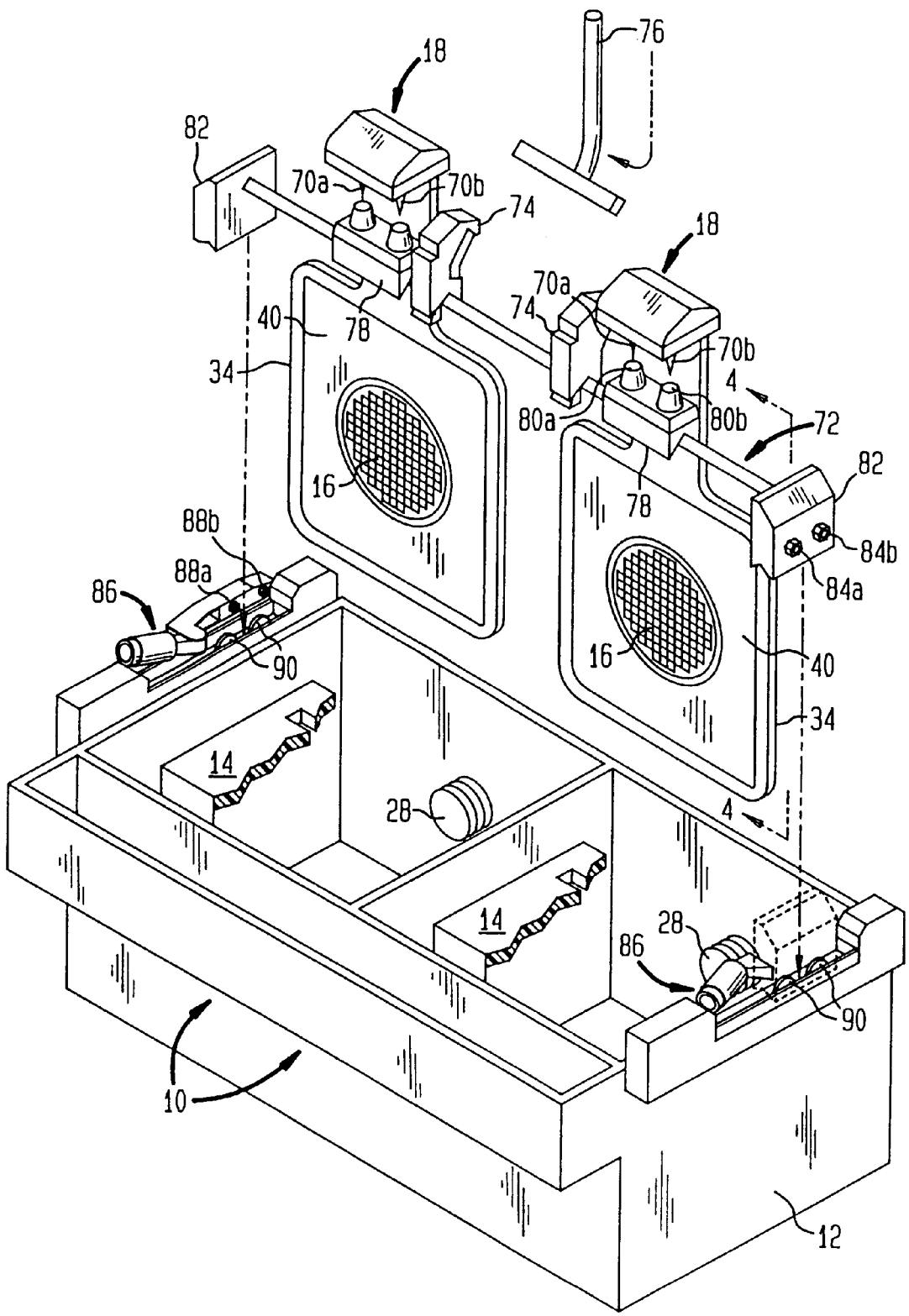
FIG. 1 is a schematic, exploded, perspective view of a pair of identical vertical paddle plating cells having a common housing in which is suspended a pair of identical fixtures for supporting workpieces to be plated.

To assist in the discussion of the present invention, the invention shall be described with respect to vertical paddle plating cells (VPPCs) 10, such as schematically illustrated in FIG. 1. It should be understood that the present invention is also applicable to non-vertical plating cells. Plating cells 10 have a common, bifurcated housing 12. Each of the cells 10 includes an identical inner cell 14 configured for use in electroplating a flat workpiece article 16. The workpiece 16 may take any conventional form that requires uniform plating thickness thereon such as recording heads, packaging modules, or integrated circuits typically used in electronic devices or computers. In the exemplary embodiment illustrated, the workpiece 16 is a flat, circular wafer having a substantial number of individual integrated circuit (IC) chip patterns arranged suitably thereon. In one electroplating process, it is desired to electrodeposit on the IC chips a uniformly thick metal, for example. In a first embodiment, the workpiece 16 is relatively fragile and is supported in a workpiece or plating rack or fixture 18 in accordance with the present invention. Two identical fixtures 18 respectively support two identical workpieces 16 for being suspended in the respective plating cells 10 adjacent to the cooperating inner cells 14.

Figure 2:
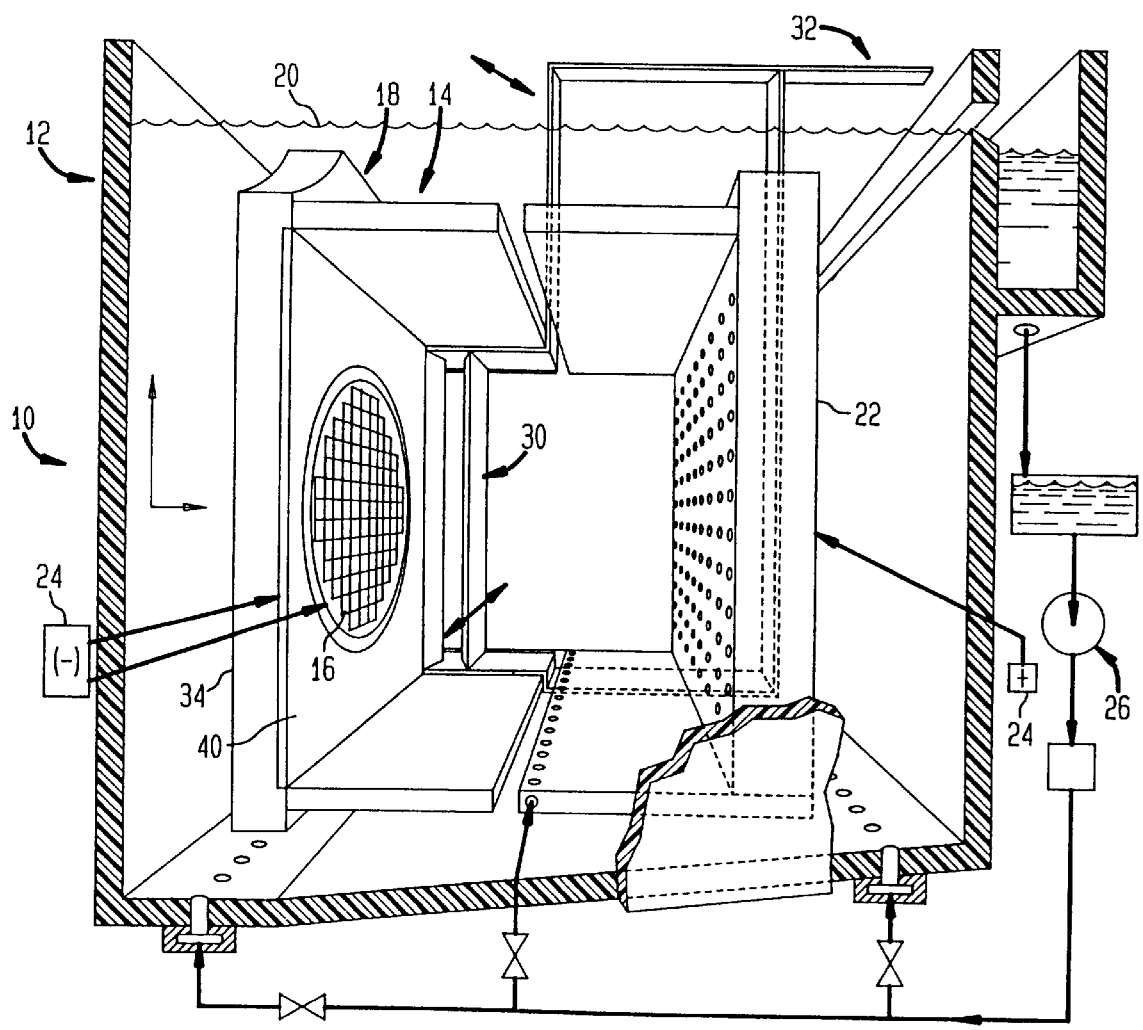
FIG. 2 is a schematic, perspective elevational view of an exemplary one of the plating cells illustrated in FIG. 1 showing one of the workpiece fixtures suspended in position therein.
Figure 3:
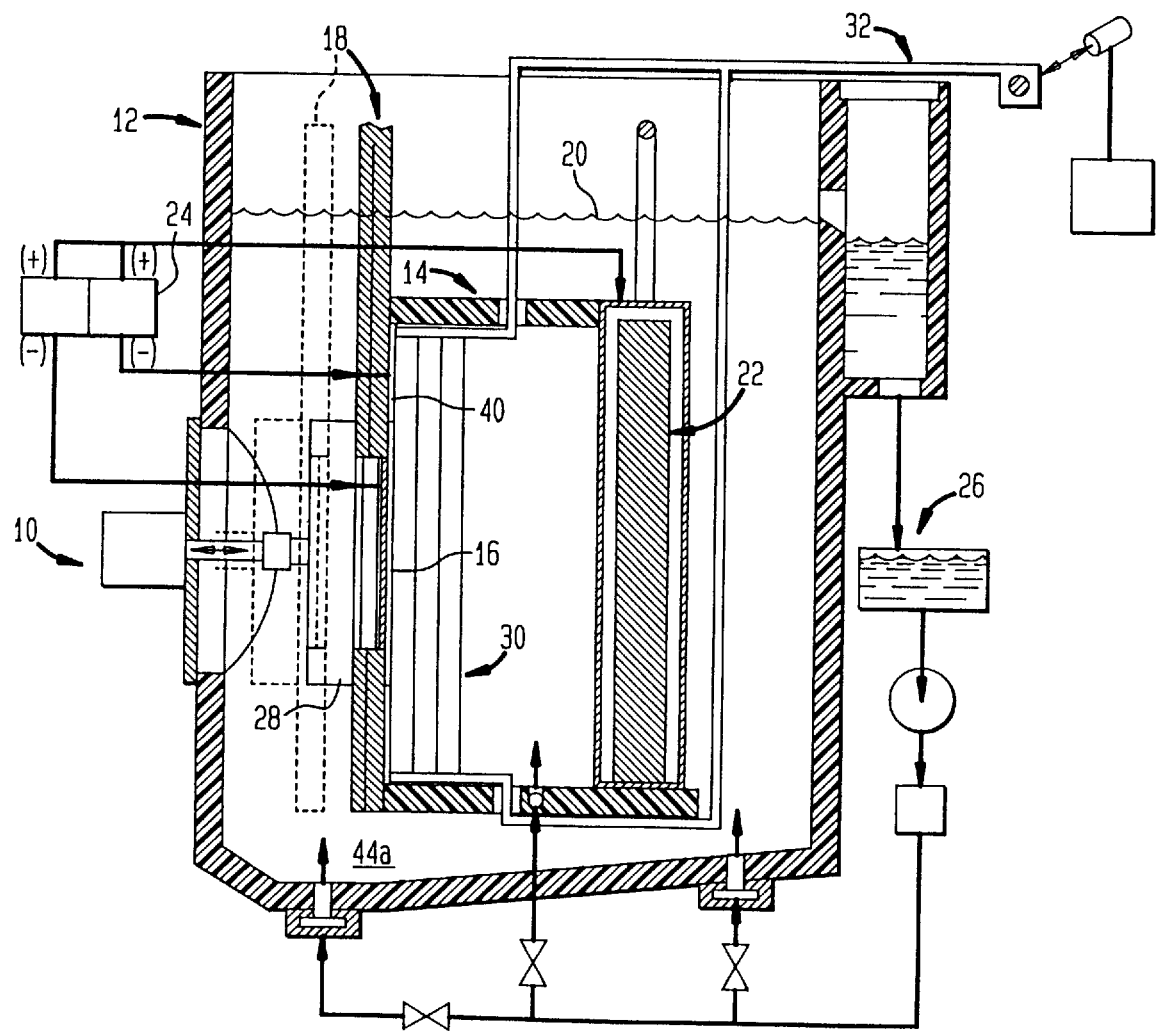
FIG. 3 is a schematic, partly sectional elevational view of the plating cell illustrated in FIG. 2.

More specifically, an exemplary one of the plating cells 10 is illustrated in more detail in FIGS. 2 and 3. Briefly, each cell 10 is substantially filled with a suitable liquid electrolyte 20 for electroplating the article 16 upon establishing an electrical current flow between the article 16, maintained as a cathode, and an anode 22 in a conventionally known manner. A conventional power supply 24, preferably a two-channel power supply, is operatively connected through suitable electrical lines to the respective workpieces 16 (and thief 40 described below) for providing a negative electrical potential (cathode), and to the anode 22 for providing a positive electrical potential in accordance with one feature of the present invention as described in more detail below. A suitable electrolyte circulation system 26 includes an external reservoir, flow conduits, pump, filter, and various valves for cleaning and mixing the electrolyte 20 as contained in the housing 12.

Each of the inner cells 14 illustrated in FIGS. 2 and 3 is open at one end for vertically receiving in position thereat the respective workpiece 16 supported in the fixture 18, with an opposite end thereof being closed by the anode 22. The fixture 18 is initially lowered downwardly into the housing 12 adjacent to the inner cell 14, and is then pushed laterally by a suitably actuated piston 28 (FIG. 3) which secures the fixture 18 in abutting contact against the inner cell 14. During the electroplating process, a vertical, double-prism paddle 30 reciprocates back and forth closely adjacent to the face of the workpiece 16 inside the inner cell 14 by a paddle reciprocating system 32 which includes suitable linkages, actuator, and controller.

A significant advantage of the inner cell 14 and its orientation in space allows for the vertical orientation of both the workpiece 16 and the fixture 18, and the anode 22. This allows relatively easy installation and removal of the fixture 18, with the workpiece 16 thereon, adjacent to the inner cell 14 for allowing automated handling thereof in a high-volume manufacturing line.

Figure 4:
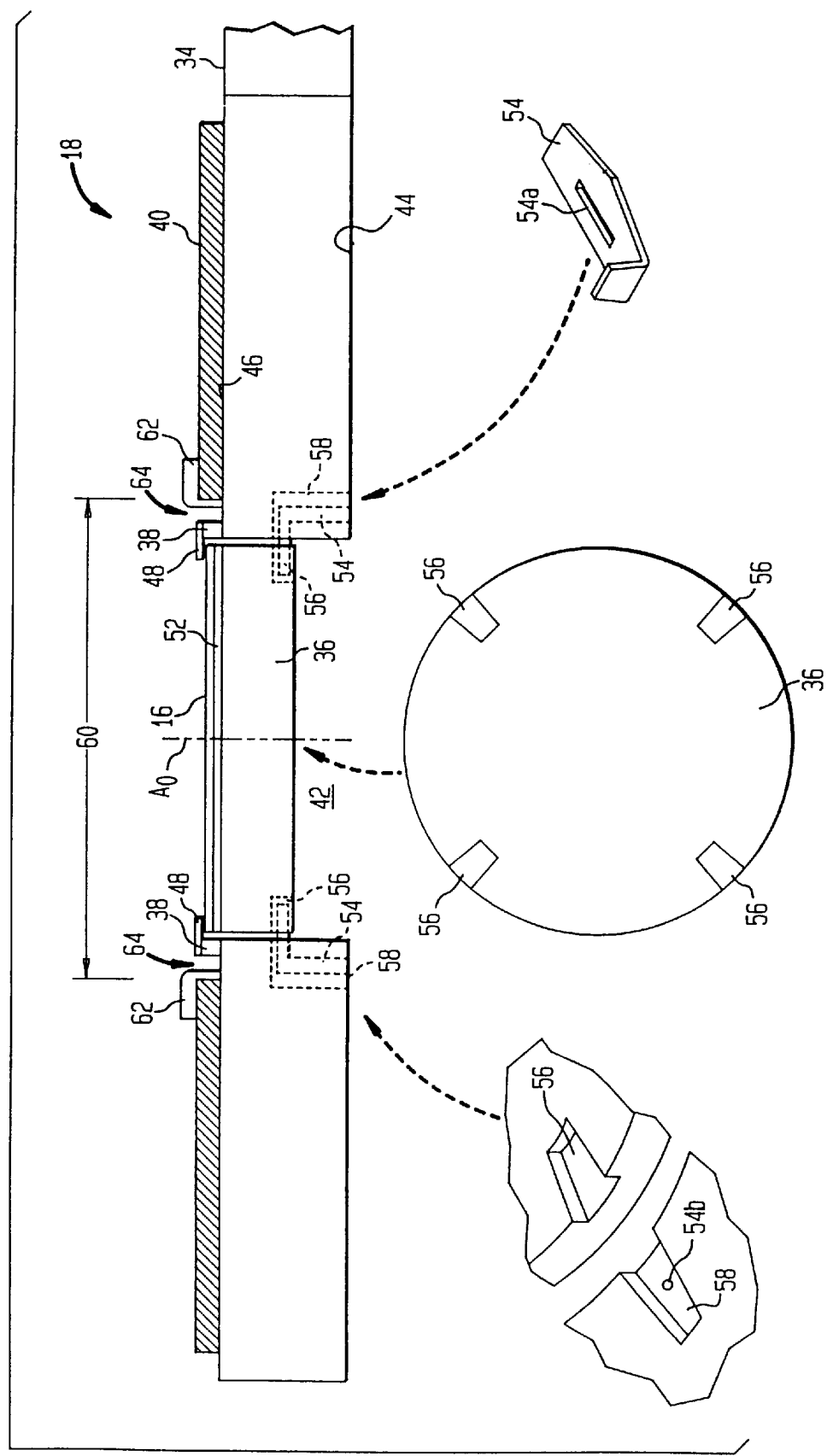
FIG. 4 is a partly sectional, side view of a workpiece fixture in accordance with the present invention.

Turning now to FIG. 4, workpiece fixture 18, in accordance with an exemplary embodiment of the present invention, includes a frame 34, a cooperating workpiece support member 36, a current distribution ring 38, and a thief 40. Frame 34 preferably includes polyvinylidene fluoride (PVDF), polypropylene, PVC, or other suitable non-conductive material, further being resistant to corrosion from the electrolyte bath. The workpiece support member 36 is configured for supporting a single workpiece 16 within an aperture 42 of frame 34. In this exemplary embodiment, workpiece 16 is circular, and therefore, the support member 36 is also circular and appropriately sized for supporting the workpiece 16. A desired amount of clearance is provided between the outer perimeter of the workpiece 16 and the inner wall of aperture 42, for example, in the range of one-half to one millimeter (0.5 to 1 mm).

Aperture 42 extends from a back surface 44 of frame 34 to and through a front surface 46 of frame 34. Attached to the front surface 46 of frame 34 is current distribution ring 38. Current distribution ring 38 includes at least a plurality of flexible contacts 48 (to be further described herein below with respect to FIGS. 5–7) which extend inwardly (e.g., radially) towards a central axis A, of aperture 42.

The workpiece 16 to be plated is placed upon a loading surface 50 of support member 36. The support member 36 preferably includes PVDF, polypropylene, PVC, or other suitable non-conductive material, further being resistant to corrosion from the electrolyte bath. In addition, a gasket or insulative elastromeric material 52 is provided for cushioning the loading surface 50 as may be desired for a particular electroplating operation. Gasket 52 is a generally flat gasket which provides for a backside seal and an improved pressure distribution on workpiece 16. Gasket or insulative material 52 can include, for example, Vitron, to provide a limited amount of flexibility. Vitron is a brand name for a non-conductive material similar to a stiff foam rubber material.

Support member 36, with a workpiece 16 mounted thereon, is inserted from the back side 44 of frame 34 into aperture 42. The workpiece 16 is brought into engagement with contacts 48 of current distribution ring 38, thus workpiece 16 is thereby located at the front side of workpiece plating fixture 18. With workpiece 16 engaged by contacts 48, support member 36 is then secured in place by suitable means. For example, one manner of securing support member 36 in place is accomplished with the use of suitable locking pins 54 secured between frame 34 and support member 36. In further detail, locking pins 54 extend between corresponding locking slots 56 formed in the underside of support member 36 and locking slots 58 in the underside of frame 34. In a preferred embodiment, there are four locking slots 56 formed in the underside of support member 36 disposed about the periphery thereof and four corresponding locking slots 58 in the underside of frame 34. The locking pins 54 further include an adjustment slot 54a to enable a degree of adjustability for securing support member 36 within aperture 42. A suitable screw fastener (not shown) is used for clamping a respective locking pin 54 at 54b in a corresponding locking slot 58 of the frame 42. While locking pins and locking slots have been described for securing support member 36 in place within aperture 42, other securing methods may be used, for example, use of any suitable known backside bellows type connection.

Referring still to FIG. 4, attached also to the front surface 46 of frame 34 by suitable fasteners is auxiliary electrode or thief 40. Thief 40 is formed of an electrically conducting metal for providing an electrical current path directly therethrough. Thief 40 may include, for example, a stainless steel plate or a titanium plate of a suitable size dimension and having a thickness on the order of one-half to two millimeters (0.5–2 mm). Preferably, thief 40 includes a metal mesh or wire screen of a suitable size dimension. The metal mesh provides a greater surface area for the thief compared to a similarly dimensioned metal plate thief. Suitable metal mesh can include No. 4 to No. 30 metal mesh, corresponding to a number of wires per inch, as is known in the art. Thief 40 further includes an enlarged aperture 60, positioned in a concentric manner with aperture 42 of frame 34. In this exemplary embodiment, workpiece 16 is circular, and therefore, the enlarged aperture 60 is also circular. Aperature 60 is further appropriately sized for providing a desired amount of clearance between an outer peripheral edge of workpiece 16 and thief 40 when workpiece 16 is secured within aperture 42. For example, such a clearance amount is in the range of three to seven millimeters (3–7 mm), preferably four millimeters (4 mm).

In accordance with an alternate embodiment of the present invention, an optional non-conductive, insulative rim coating 62 is provided upon an inner boundary edge rim region of the enlarged aperture 60. As a result of the optional rim coating 62, an effective plating surface of the thief 40 is moved farther away from the workpiece, while the electrical field effects of the thief 40 remain in close proximity to workpiece 16.

Figure 5:
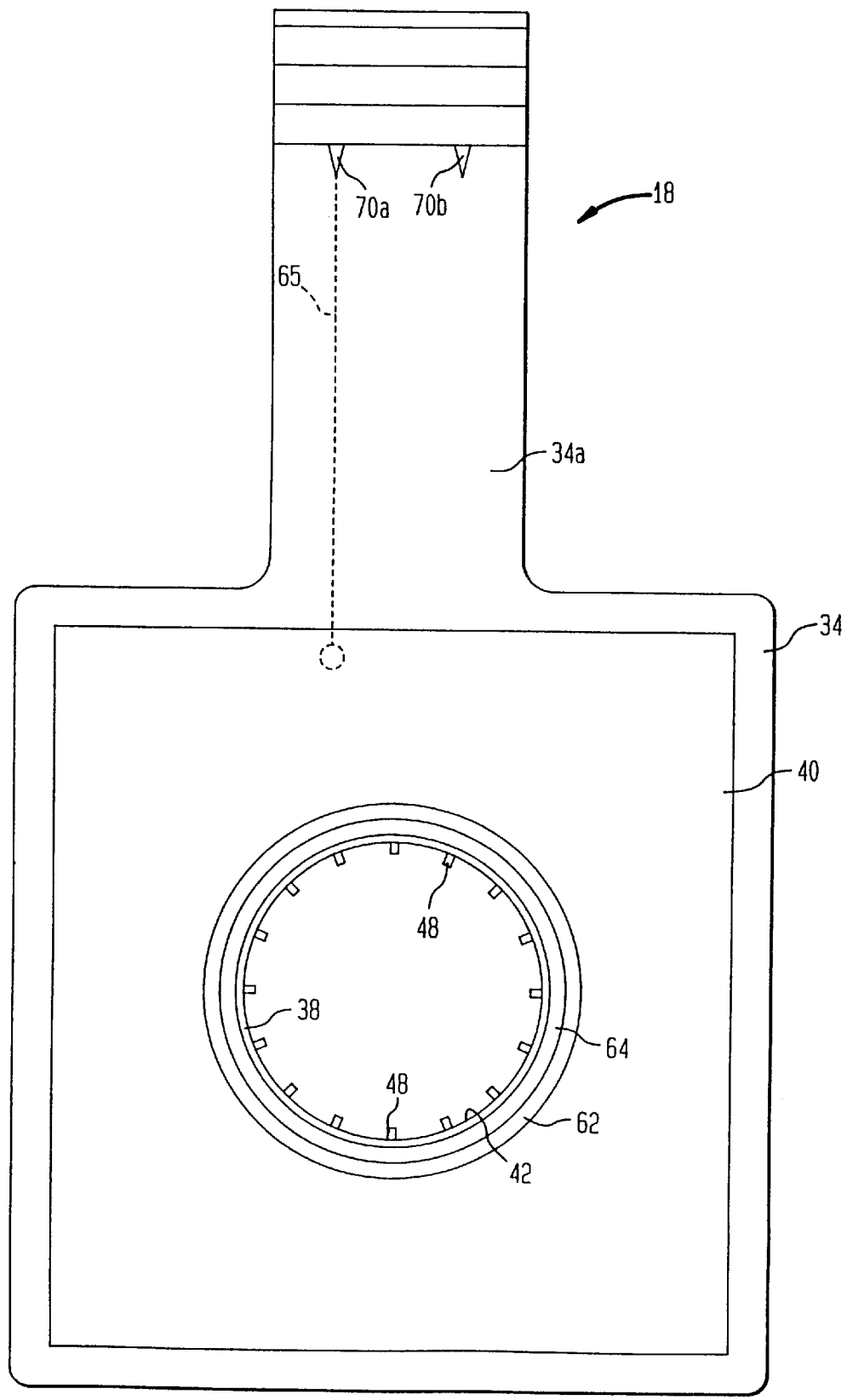
FIG. 5 is a schematic, top view of the workpiece fixture according to the present invention.

With the structure of the workpiece fixture 18 as discussed herein above, the present invention provides and makes use of a continuous conductive liquid gap region 64 during an electroplating process. The continuous conductive liquid filled gap region 64 is on the order of 1 to 5 mm between the thief and the workpiece, further having a depth on the order of three to five millimeters (3–5 mm). In other words, there is a gap in (or absence of) material between the workpiece 16 and the thief 40, as shown in FIGS. 4 and 5, which forms gap region 64. During a plating process, the gap region 64 fills up with the conductive electroplating bath, thereby forming a continuous conductive liquid gap region. As a result, bridging due to plating of material over the region or space between the thief 40 and workpiece 16 is greatly minimized and thus frequent problems therewith are essentially eliminated. Furthermore, a mean time between cleanings of the workpiece fixture 18 has been advantageously extended by greater than three orders of magnitude.

According to the present invention, a premature bridging of a workpiece 16 to a thief 40 by the plating of material is prevented by the use of a liquid gap spacer region 64 between the thief and the workpiece. In addition, for some materials, as in the case of Pb—Sn (lead-tin), cathode life can be further prolonged by providing a coating 62 on an inner rim of the cathode. Rim coating 62 is preferably a continuous thin coating, on the order of 0.5 $\mu$m thick, of PVDF, PVC, polymer or other suitable material.

The inner rim coating 62 prevents an undesired delamination of plated material from the thief 40. The rim coating 62 moves the effective plating area of the thief 40 farther away from the workpiece 16. The rim coating 62 is also applicable in the deposition of films with high intrinsic stress. Plated material which builds up on the thief 40 may be subject to delamination, that is, it may separate from the thief. It is highly desirable to avoid any contamination of the workpiece 16 by delaminated material which separates from the thief 40.

With the rim coating 62, a physical edge of the thief 40 remains close to the workpiece 16 while a plating edge of the thief 40 is effectively moved farther away to prevent delamination. Delamination of material creates floaters in the electrolyte bath, thus requiring down-time to clean and strip all excess plating from surfaces of the equipment. Undesired delamination and shorting out of components also leads to a disruption in obtaining a desired uniformity deposited film on a workpiece. The rim coating 62 acts as an indirect extension of the liquid gap region 64, wherein rim coating 62 extends the effective plating edge of the thief 40 (i.e., a starting point for plating on the thief) approximately on the order of 2–4 mm away from the physical edge about aperture 60 of the thief 40. In other words, plating on the thief occurs about 2–4 mm away from the liquid spacer gap region 64, thus minimizing a possibility for delamination. Furthermore, plating upon the thief 40 is diffused and does not occur on a sharp corner edge at the liquid flow boundary of the liquid spacer gap region 64, thus preventing delamination. The rim coating 62 allows the plating fixture according to the present invention to be used for a greatly increased number of times over the prior art plating fixture before any renewing is required (i.e., cleaning and stripping of plated material).

In accordance with the present invention, a gap region 64 is positioned between a workpiece 16 (such as a semiconductor wafer) and a coplanar thief 40, whereby the workpiece 16 is isolated from the thief. Alternatively, the workpiece and the auxiliary electrode may be non-coplanar as may be required for a particular electroplating operation. The liquid spacer gap region 64 is on the order of 3 to 10 mm, separating the workpiece 16 from the thief 40, and more preferably on the order of 4 mm. The present invention provides relief for an undesired bridging of workpiece 16 and thief 40 during electro-deposition of metals. Such metals include Cu, Pb—Sn alloys, Nickel, Cr, Au, Pt, Co, Zn, Ag, Pd, Rh, and their respective alloys. Desired electroplated metal thicknesses for high performance semiconductor chip wiring applications is on the order of less than three microns (<3 $\mu$m), including sub-half micron.

The present invention further provides for the ease of workpiece loading and unloading within the workpiece plating fixture 18. The workpiece plating fixture 18 includes a multi-contact distribution ring 38. Distribution ring 38 is mounted upon frame 34, concentric with aperture 42, using suitable fasteners, for example, screws. The multi-contact distribution ring 38 includes a solid conductive ring portion 39 and a number of contacts 48. Contacts 48 are fastened to the conductive ring portion 39 using suitable fasteners, for example, screws, and positioned for contacting the workpiece 16 on a top surface thereof inwardly from its edge. The number of contacts 48 of distribution ring 38 can range, for example, from eight to sixty-four (8–64) contacts. Distribution ring 38 is further coated with a coating 41 (e.g., insulative), such as, PVDF or TEFLON, for example, except for the contacting portions of contacts 48. In this manner, plating onto distribution ring 38 is contained to only those exposed areas of contacts 48. Alternatively, a coating of alpha-tantalum (or other suitable conductive film that Cu or other metal of interest will not plate on) can be used as or in addition to the coating 41, in which case the conductive film envelopes each contact 48 including its contacting portions. Plating during an electrodeposition process onto the entire distribution ring 38 is thus avoided.

Figure 9:
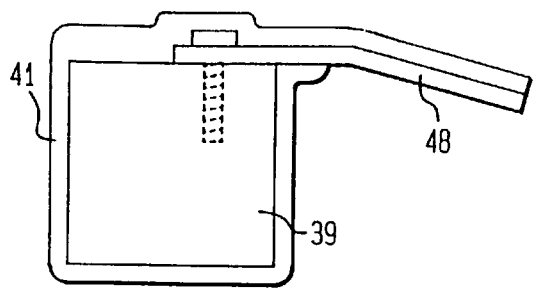
FIG. 9 is a schematic cross-sectional view of one embodiment of the current distribution ring according to the present invention.

Contacts 48 of current distribution ring 38 include suitable contact tabs or fingers of a desired length, for example, on the order of less than 5 mm (See FIG. 9). Contacts 48 may include copper, beryllium copper, titanium, or flexible stainless steel leaf springs. The leaf springs are slightly curved, being two to three millimeters (2–3 mm) wide and having a slight curvature along a length dimension thereof. When mounted with suitable fasteners, upon the solid conductive ring portion 39, contacts 48 extend in a direction of workpiece 16. An advantage of the stainless steel leaf spring is that it is reusable after encountering a cleaning and stripping operation. That is, when a certain amount of plating material build-up has occurred, the build-up can be etched or stripped off. In the case of stainless steel, it can be reused.

Figure 10:
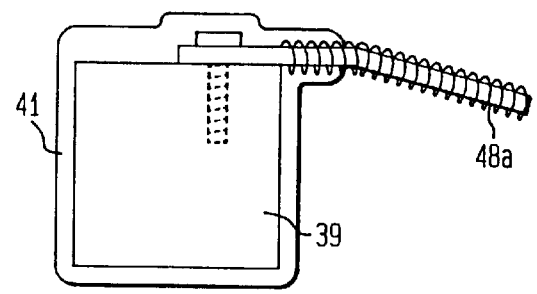
FIG. 10 is a schematic cross-sectional view of another embodiment of the current distribution ring according to the present invention.

Alternatively, contacts 48 may further include coil shaped tension/compression springs disposed along a length dimension thereof over a respective leaf spring, tab or finger (See FIG. 10). The horizontal disposition of each coil shaped tension/compression spring helps to reduce any possibility of workpiece breakage resulting from a sharp contact point. That is, the essentially horizontally disposed tension/compression spring provides no sharp single contact point, rather it provides multiple, gentle contacting points through the cylindrical surfaces of the coil spring. The gap between individual coils of the coil spring can be on the order of less than one-half millimeter (<½ mm). During an electroplating process, plating occurs on inside grooves of each coil spring, wherein an undesired sharp contact point build-up does not occur. Desirably, the coil spring is coated with alpha-tantalum or other conductive film that resists plating of the metal to be electro-deposited.

As a further alternative, contacts 48 are formed (e.g., suitably cut and shaped) from a conductive metal mesh or wire screen such as No. 3 to No. 9 titanium, stainless steel, copper or other suitable electrical conductor marketed by Unique Wire Weaving Co., Inc., Hillside, N.J.

As an additional alternative explained in conjunction with FIGS. 13A–D, the contacts 48 include a number of electrically interconnected and conductive wire turns 48c disposed along a circumference of the ring 38, rather than including tabs, fingers or leaf springs. For example, a ring 38c includes conductive ring portion 39c having (e.g., fixed by screws, or by forming as a unitary member with 39c) a conductive ring extension 39cc. Extension 39cc includes a channel C (FIG. 13C) extending continuously along a circumference of the extension 39cc, in which circular electrical conductors 48cc (e.g., spiral-wound loops of a continuous coil spring) are disposed by, e.g., staples or a suitable conductive adhesive. A coating 41c is disposed on the ring 38c as shown. Preferably, all of the conductors 48c are completely coated with alpha-tantalum or other suitable conductive film. In which case the coating 41c may also be alpha-tantalum or other suitable conductive film.

The spring (FIG. 13D) is formed of a suitable metal (e.g., spring-tempered steel) or combination of metals, and is available, e.g., from Unique Wire Weaving Co. Alternatively, the spring comprises an elastomeric material (e.g., Vitron brand) coated with a film of titanium, alpha-tantalum or other suitable conductive material. The spring 13 is suitably arranged and dimensioned on the extension 39cc, such that a curved contact surface S along a width (W) dimension of the turn 48c suitably contacts the workpiece 16 during an electroplating operation.

The particular number of contacts used for a particular electroplating operation is determined in part by a desired current density at each contact point between each contact 48 and workpiece 16. The desired current density is further related in part to the thickness of an initial seed layer on the workpiece to be plated. A seed layer thickness for high performance semiconductor chip wiring applications may be on the order of less than 1000 Å, further in the range of ten to one hundred nanometers (10–100 nm). A seed layer is typically formed by sputtering, in preparation for an electroplating operation. An excessive current density at the contact points would be detrimental to the seed layer, for example, resulting in seed layer burn-out at a contact point and thus presenting a uniformity issue. However, excessive current density can be minimized with the use of an increased number of electrical contacts 48 as appropriate.

Figure 7A:
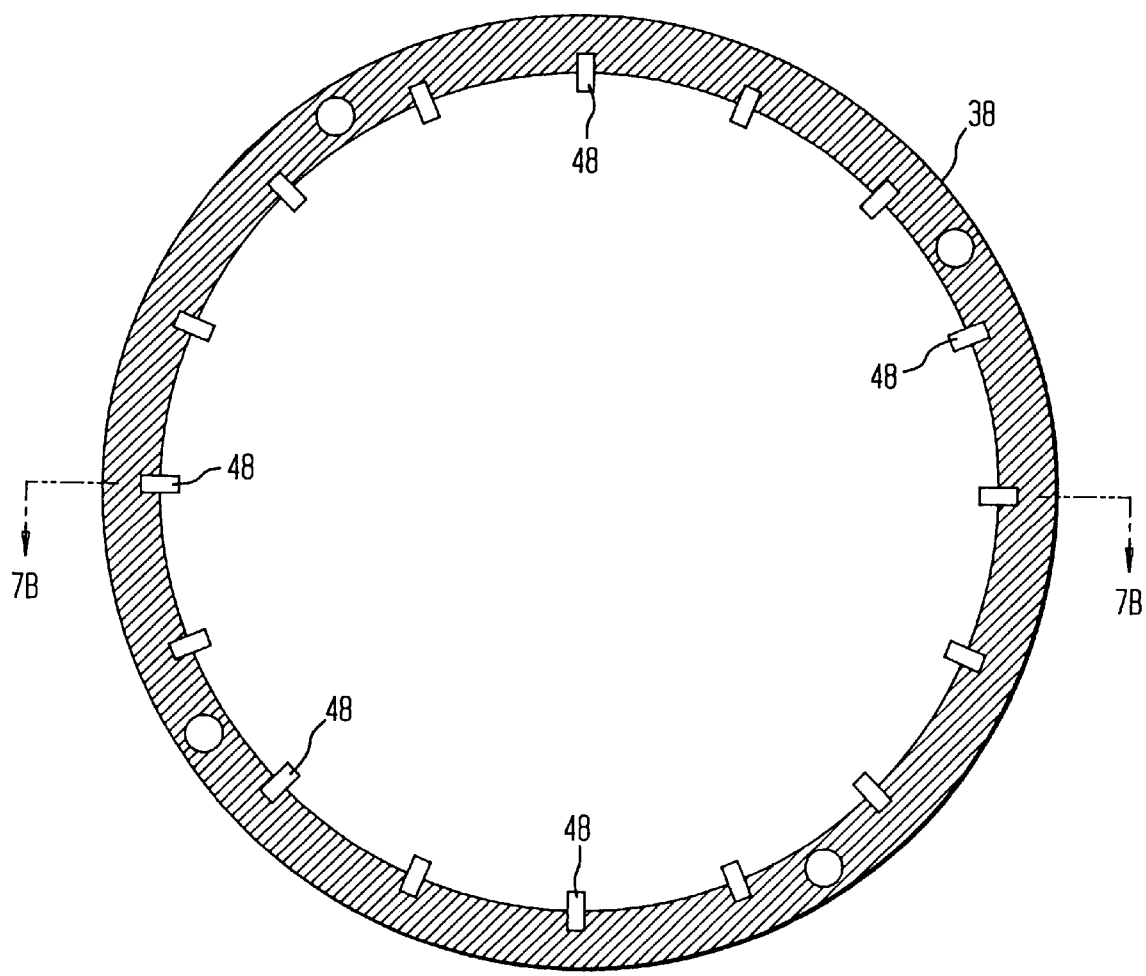
FIGS. 7A and 7B are schematic views of the current distribution ring of the workpiece fixture in accordance with the present invention.
Figure 7B:
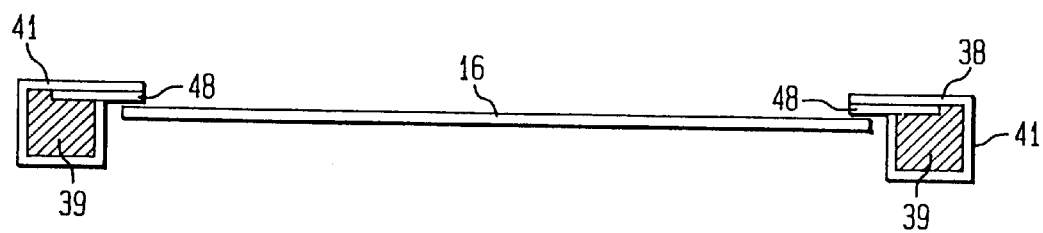
Figure 8A:
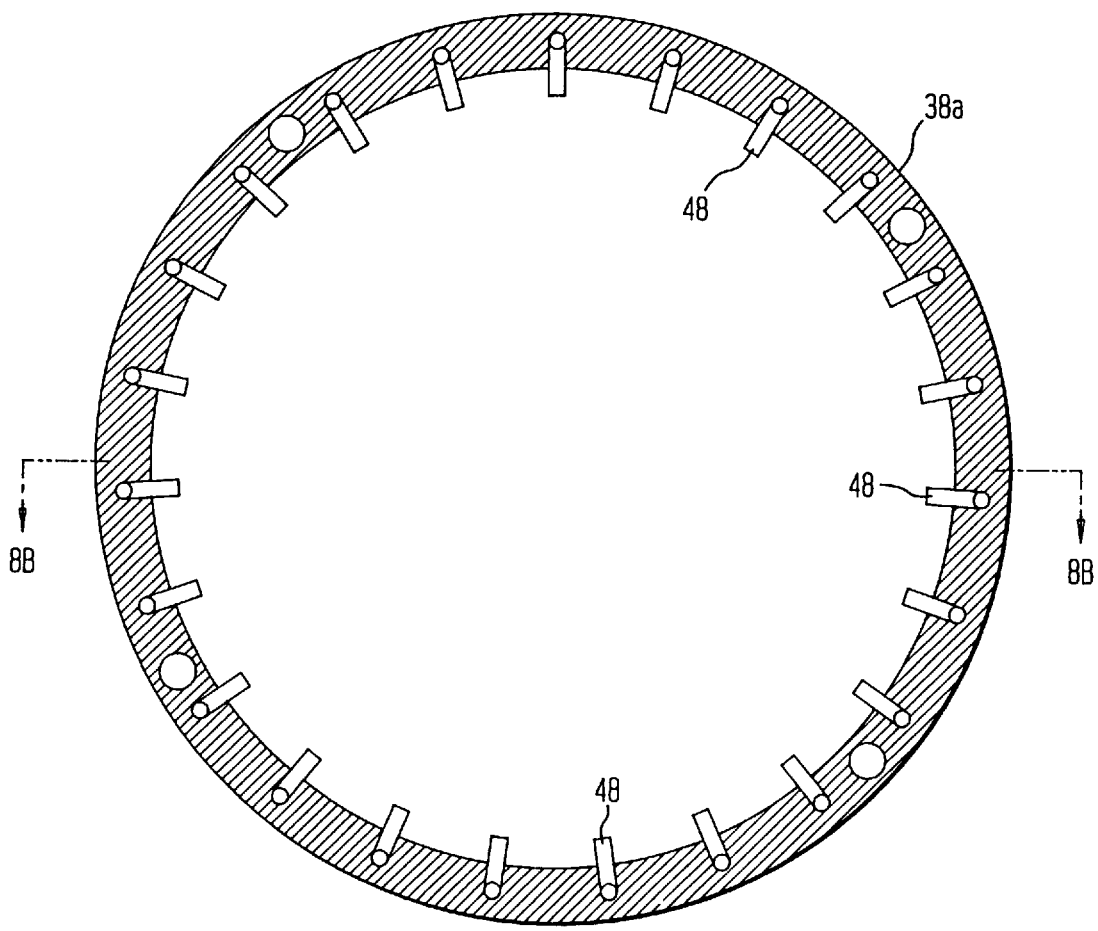
FIGS. 8A and 8B are schematic views of the current distribution ring of the workpiece fixture in accordance with another embodiment of the present invention.
Figure 8B:
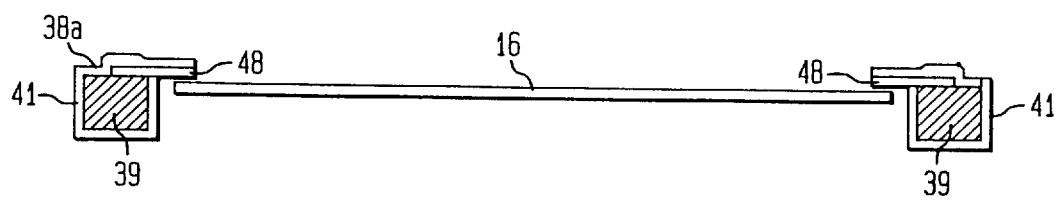

In the instance of the workpiece 16 including a 200 mm semiconductor wafer, the multi-contact distribution ring 38 preferably includes greater than ten (10) contacts 48 which are suitably located and positioned in an equally spaced manner for making electrical contact inwardly on the order of three millimeters (3 mm) from the outer peripheral edge of the wafer 16 about the periphery thereof (FIG. 7). As an additional example, the number of contacts can be as many as 200. Also, for a 300 mm semiconductor wafer, the desired number of contacts on the multicontact distribution ring 38a are on the order of twenty (20) to fifty (50), for making contact about the wafer periphery. In the later instance, preferably, the number of contacts 48 is forty (40) which are suitably located and positioned in an equally spaced manner for making electrical contact inwardly on the order of two to three millimeters (2–3 mm) from the outer peripheral edge of the wafer about the periphery thereof (see for example, FIG. 8). As an additional example, the number of contacts can be as many as 1000.

Figure 6:
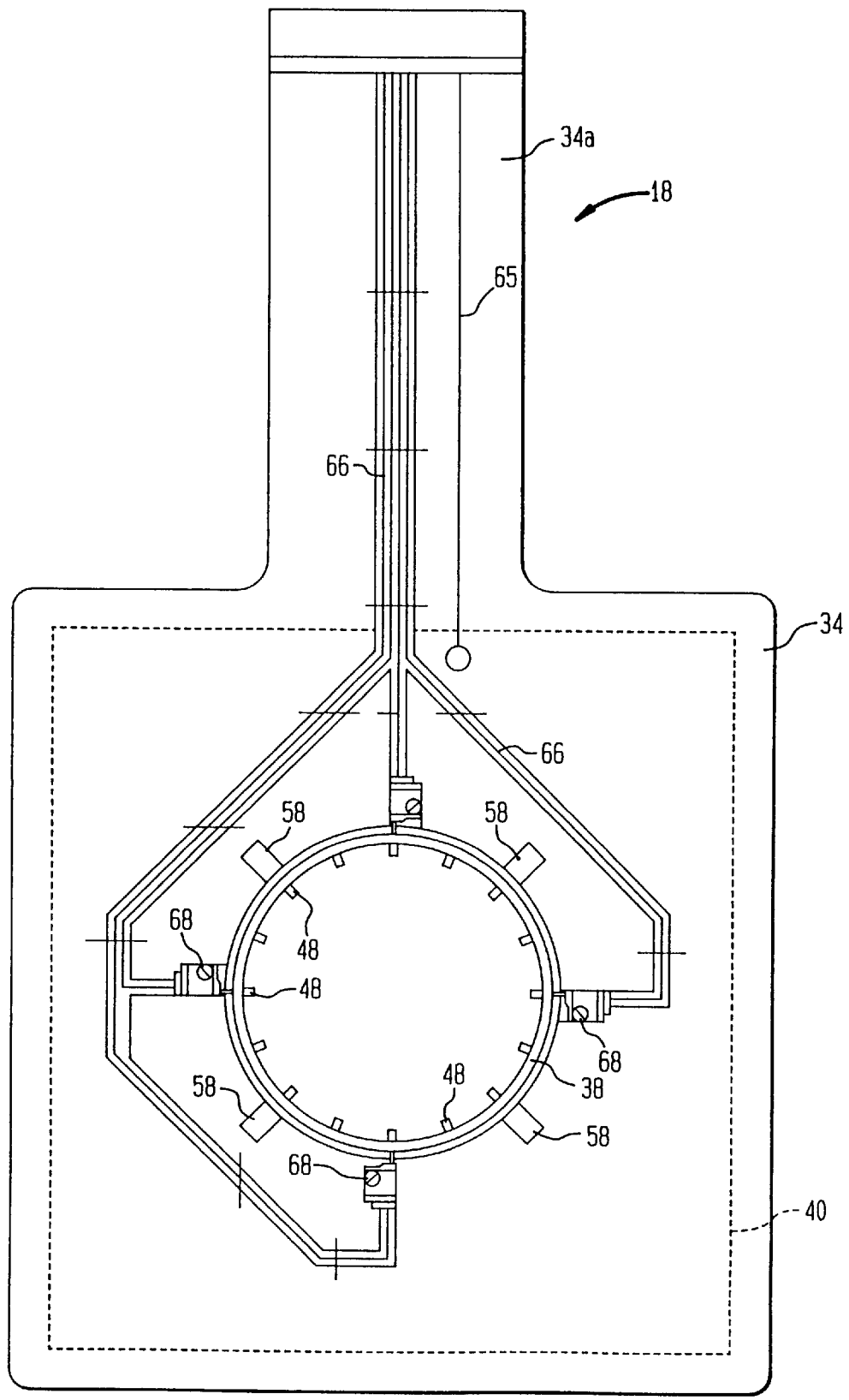
FIG. 6 is a schematic, partly sectional, bottom view of the workpiece fixture according to the present invention.

Turning now to FIGS. 5 and 6, the frame 34 of workpiece plating fixture 18 is illustrated in more particularity. Frame 34 includes a elongated arm portion 34a for removably positioning the frame 34 into the plating cell 10. A front view of fixture 18 is illustrated in FIG. 5, while a rear view of workpiece plating fixture 18 is illustrated in FIG. 6.

As discussed herein above, each fixture 18 is specifically configured for supporting a workpiece 16 for electroplating thereof. Accordingly, suitable electrical current paths are separately provided to the workpiece 16 to establish negative potential threat and forming a cathode. In the exemplary embodiment illustrated in FIG. 5, the entire workpiece frame 34 is preferably formed of a suitable plastic material which is a dielectric or electrical insulator as well as being resistant to corrosion from the electrolyte 20. For example, frame 34 may be formed of polyvinylidene fluoride (PVDF) or other suitable material.

In the exemplary embodiment illustrated in FIG. 5, the thief 40 is formed of stainless steel for providing an electrical current path directly therethrough. Thief 40 provides an auxiliary electrode current path through the electrolyte 20 when positioned across the inner cell 14 as illustrated in FIG. 2. Any suitable insulated electrical wire or electrical line 65 is electrically coupled between thief 40 and a cone 70a, further as discussed herein below.

In order to provide an independent and separate electrical current path to the cathodic workpiece 16 positioned within the workpiece aperture 42, a plurality of electrical contacts or pins 48 (as shown in FIGS. 5–7) are circumferentially spaced apart around an inner perimeter of current distribution ring 38. Contact pins 48 are for electrically contacting the top side of the workpiece 16 when the workpiece 16 and support member 36 are supported inside aperture 42.

A plurality of insulated electrical lines or wires 66 are electrically coupled between a cone 70b and the current distribution ring 38. Wires 66 are coupled to distribution ring 38 in several places, for example, four equally spaced apart locations, further for providing a desired current density distribution. Electrical lines 66 are joined to the current distribution ring 38 through suitable housings 68 for providing separate current paths equally distributed about current distribution ring 38. For example, the terminal ends of wires 66 can be respectively mounted underneath the current distribution ring 38 using a suitable screw and spring assembly. In addition, the lead terminations can be fitted into blind holes (not shown) on a mating side surface of the distribution ring 38. The electrical lines 66 are also suitably channeled and secured in corresponding troughs formed in the back side of the frame 34 to protect lines 66 therein, further which are suitably insulated, for example, with a TEFLON coating.

Referring again to FIG. 5, the workpiece fixture 18 further includes first and second electrical contact cones 70a and 70b fixedly joined to the distal or top end of the elongated arm portion 34a. The two cones 70a,b are aligned parallel with the elongated arm portion 34a and point downwardly toward the main body of frame 34. The two cones 70a,b allow the entire fixture 18 to be vertically suspended in the plating cell 10 as illustrated in FIG. 1 while providing automatic electrical connections to the thief 40 and current distribution ring 38. The first cone 70a is suitably directly electrically joined to the thief 40 via electrical wire 65 for providing a direct current path to the thief 40. The second cone 70b is suitably electrically joined to the plurality of electrical lines 66, such as with the use of a common bus bar (not shown) for providing separate current paths to the current distribution ring 38. The two cones 70a,b provide independent electrical current paths to the thief 40 and the current distribution ring 38, respectively. Other suitable arrangements for electrically joining the two cones 70a,b to the thief 40 and the current distribution ring 38 may be used as desired.

In order to suspend and provide electrical connections to each plating fixture 18, an elongate flybar 72 is provided for straddling or spanning the two cells 10 as shown in FIG. 1, or more as desired. Although the flybar 72 may be configured for supporting an individual fixture 18, in a respective plating cell 10, in the exemplary embodiment of FIG. 1, the flybar 72 is configured for identically supporting two fixtures 18 in their respective plating cells 10 across the common housing 12.

The flybar 72 includes a pair of axially spaced apart support hangers 74 suitably fixedly joined thereto for lifting the flybar 72 and in turn lifting the two fixtures 18 supported thereon. The hangers 74 are illustrated in FIG. 1, adjacent to a lifting hook 76 having a T-shaped distal end which is readily inserted into the cooperating support hangers 74. The flybar 72 further includes a pair of identical support blocks 78 suitably fixedly joined to an intermediate section of the support beam on respective sides of the hangers 74. Each of the support blocks 78 includes first and second electrically conductive conical receptacles 80a and 80b for respectively receiving the downward pointing first and second cones 70a,b at the top of the fixture 18. In this way, each fixture 18 may be readily loaded downwardly atop its respective support block 78, with the cooperating cones 70a,b and receptacles 80a,b providing an effective and accurate interconnection. The support hangers 74 straddle the center of the flybar 72, with the support blocks 78 being equally disposed outboard thereof so that the two fixtures 18 are balanced on the flybar 72 for allowing lifting thereof by the centrally located lifting hook 76.

The flybar 72 is loaded atop the common housing 12 of the plating cells 10 and includes a pair of end blocks 82 which are suitably fixedly joined to opposite ends of the support beam. At least one, and preferably both of the endcaps 82 includes first and second electrical contact buttons 84a and 84b. Buttons 84a,b are suitably electrically joined to respective ones of the receptacles 80a,b by corresponding first and second electrical wires (not shown) which may be conveniently channeled through the flybar support beam, in such case as the beam being hollow. The buttons 84a,b of each of the endblocks 82 are preferably separately wired to respective ones of the receptacles 80a,b of the support blocks 78 for providing independent electrical current paths thereto. Suitable clamping assemblies 86 are provided atop both ends of the housing 12, including a pair of spaced apart first and second electrical supply terminals 88a and 88b. Clamp assemblies 86 are selectively positionable to clamp the flybar 72 in axial compression, wherein the first button 84a and the first terminal 88a abutting together to establish the current path to the thief 40 through the intermediary electrical joints. The second button 84b and the second terminal 88b abut together to establish the separate current path to the current distribution ring 38 through respective intermediary electrical joints. One or more power supplies 24 is operatively connected to suitable electrical wires to the respective first and second terminals 88a and 88b to independently provide current paths thereto. Thus independent negative, cathodic electrical potential is provided at the thief 40 and the workpiece 16.

As discussed above and shown in FIG. 3, the fixtures 18 are loaded vertically downwardly into the plating cells 10 and then translated into abutting position against the inner cells 14 by the actuated piston 28. To accommodate the slight transverse movement of the fixtures 18, the flybar endblocks 82 are seated atop a plurality of aligned wheels or rollers 90. Preferably, two pairs of the rollers 90 are disposed atop the plating cell 10 at opposite ends of the housing 12 thereof. Once the fixtures 18 are positioned against the inner cells 14, the two clamps 86 are actuated to engage the cooperating buttons 84a,b and terminals 88a,b for completing the separate electrical current paths and securely clamping the flybar 72 into position which prevents unintended movement thereof during the electroplating process.

With respect to the present invention, loading of the workpiece 16 onto the plating fixture 18 is accomplished via the back side of the plating fixture. The workpiece 16 is brought into contacting engagement with the contact pins 48 of the current distribution ring 38. The array of spaced apart pins 48 protrude from the distribution ring in a direction of the center of aperture 42, wherein the workpiece 16 rests upon the pins. Only those portions of the contact pins 48 which make contact with the workpiece are exposed (i.e., not insulated). The ring itself and the non-contacting portions of the contact pins 48 are principally insulated, for example, using any suitable insulative coating, such as, PVDF or TEFLON. The workpiece 16 is then held in place between the contact pins 48 of the distribution ring 38 and a support member 36. Support member 36 is then suitably locked in place at an underside thereof with locking pins 54.

During electroplating, everything within the bath is shorted out, via the electrolyte, since the bath is conductive. The relative conductivity between the exposed metal (of the workpiece and auxiliary electrode, independently) and the bath is higher than the conductivity of the bath across the liquid spacer gap region.

Agitation is used during electroplating by agitating the workpiece or the electrolyte solution to facilitate mass transfer. Agitation of the bath can be accomplished using a paddle, stirrer or wiper to move the bath around. Agitation ensures that there are no stagnate zones in the bath during electroplating.

In accordance with the present invention, a substrate or workpiece 16, such as a semiconductor wafer, is rested upon the partially insulated current distribution ring 38 from a back side direction of frame 34. The partially insulated current distribution ring 38 is characterized by a plurality of electrical contacts 48 spaced about the perimeter of the substrate 16 undergoing the electroplating process. The distribution ring 38 is further separated from the auxiliary electrode 40 by a liquid gap region 64. The auxiliary electrode 40 can include a co-planar or a non-coplanar auxiliary electrode. The gap design, according to the present invention, dramatically reduces the occurrence of a direct shorting (with plated material) of the substrate to the auxiliary electrode without sacrificing electoplating uniformity.

The present invention further provides advantages which include elimination of frequent thief/wafer inspection during and between multiple plating operations in an electrodeposition process. No premature shorting between the workpiece and the thief occurs and thus no loss due to downtime is incurred for an electroplating process. The present invention further provides improved productivity and longer cathode life on the order of greater than 1000 times over present known processes. Frequent replacement of an auxiliary electrode is overcome by the present invention. Cathode rework is lessened. Still further, use of the liquid gap region 64 enables decoupling of the workpiece from the thief, thus the workpiece can be rotated around a stationary thief.

Figure 11:
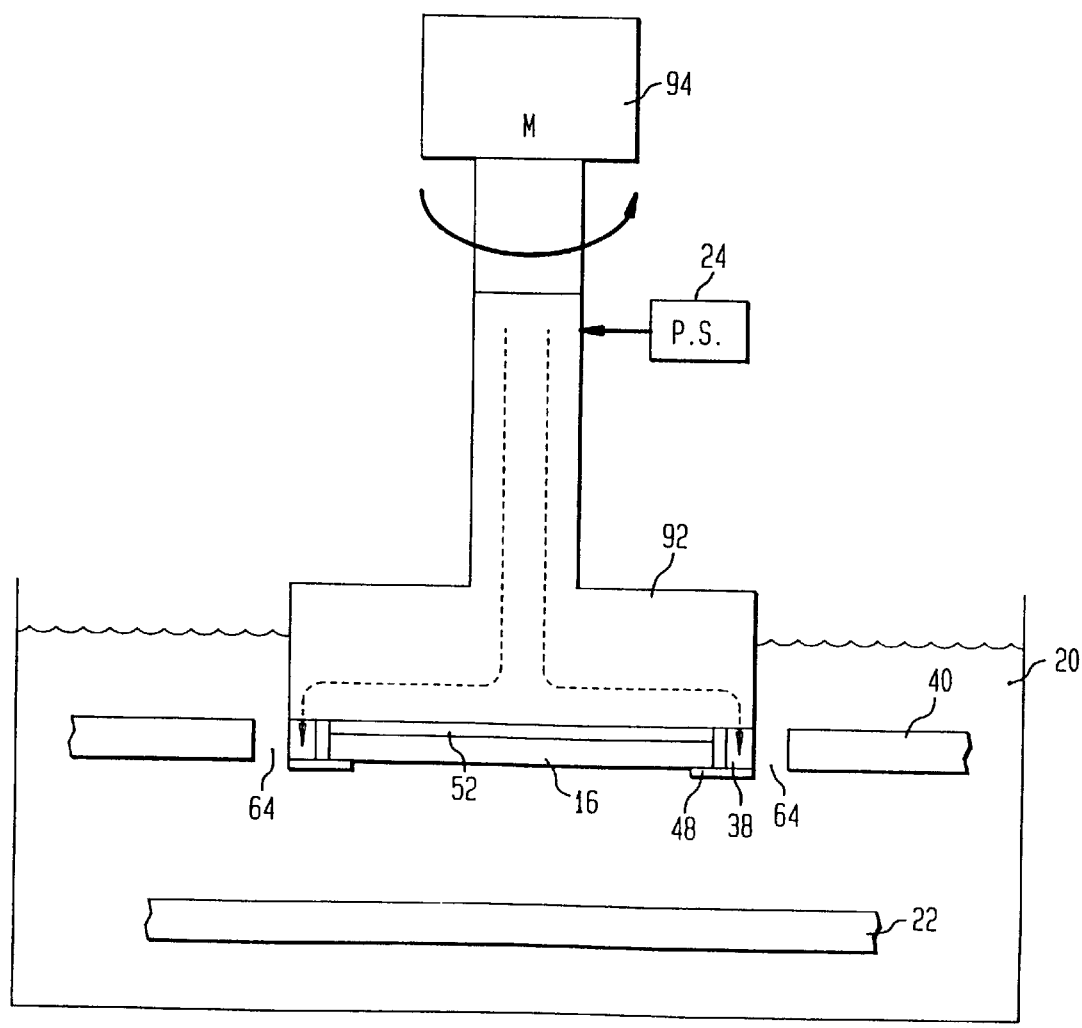
FIG. 11 is a schematic representation of yet another alternate embodiment according to the present invention.

The present invention provides for a liquid gap region that effectively decouples the workpiece from the auxiliary electrode (thief). In an alternate embodiment, with the use of suitable rotation mechanisms, the workpiece could be rotated independent of the auxiliary cathode (FIG. 11). With the latter arrangement, the thief need not be coplanar with the workpiece also. For example, the current distribution ring and workpiece can be physically separated from the thief. The wafer and distribution ring could be coupled to a motor shaft for enabling a rotation thereof. In this instance, the thief can be parallel, in plane or out-of-plane, or perpendicular to the workpiece, further as discussed below.

In the alternative embodiment, as shown in FIG. 11, a wafer 16 is loaded onto distribution ring 38 in a direction facing the plating solution 20. The distribution ring 38 is picked up by a plating head 92 by suitable vacuum clamping, while the elastomeric seal 52 on the head 92 seals the wafer or workpiece 16 backside. The elastomeric seal 52 also distributes the pressure evenly on the water 16 and contacts 48 on the front thereof. This prevents the workpiece 16 from sliding around during plating. A motor 94 provides rotation of the plating head 92 as desired for a particular plating process.

With the apparatus of FIG. 11, the workpiece 16 is lowered into the plating bath 20 inside a concentric planar or non-planer thief 40. Electrical contract to the distribution ring can be made through a suitable slip ring arrangement or assembly (not shown) on the plating head 92.

Figure 12A:
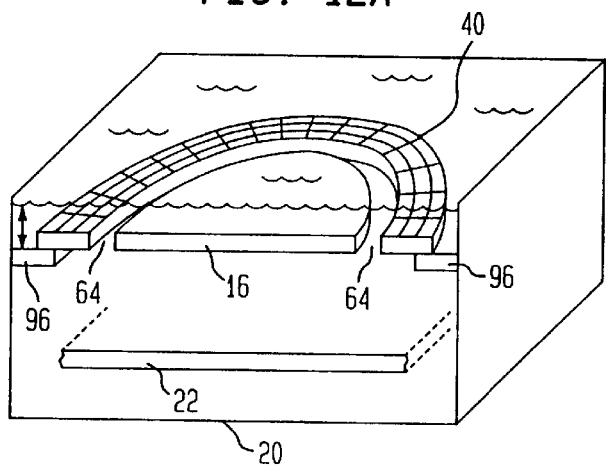
FIGS. 12A–E illustrate various metal mesh thief electrode and workpiece placement configurations according to the present invention.
Figure 12B:
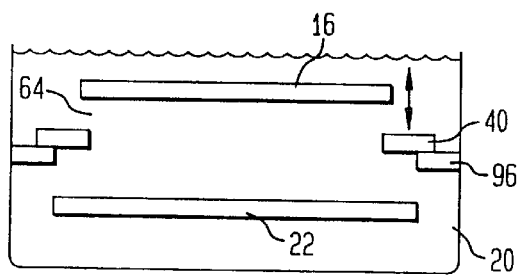
Figure 12C:
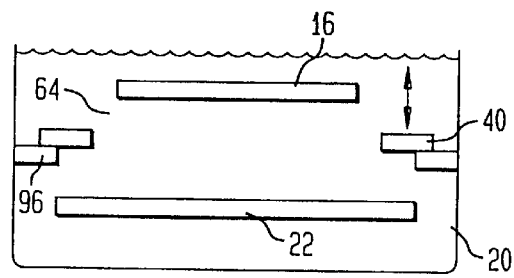
Figure 12D:
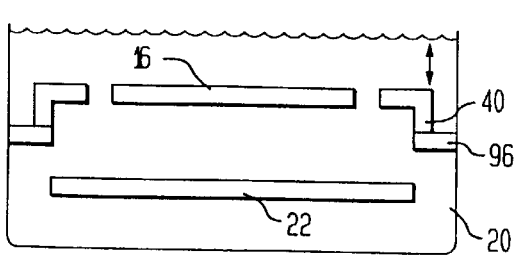
Figure 12E:
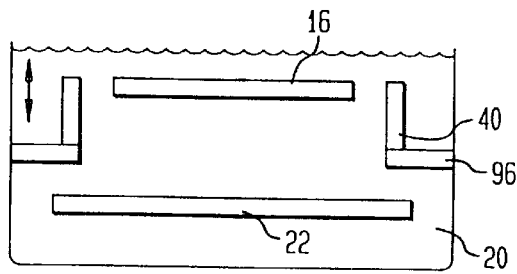
Figure 13A:
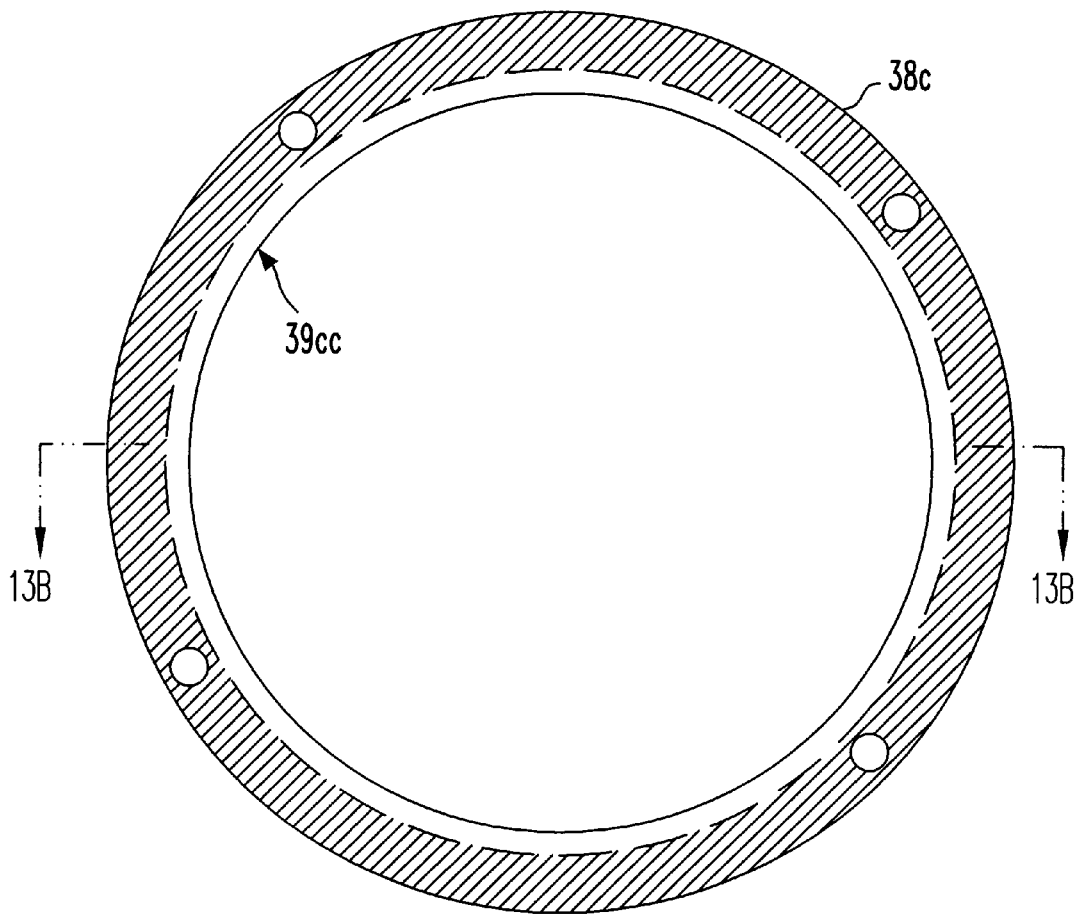
FIGS. 13A–D are schematic views of a further alternative embodiment of a distribution ring and contacts according to the present invention.
Figure 13B:
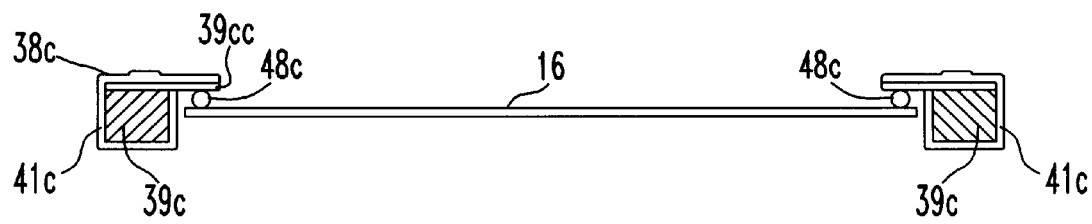
Figure 13C:
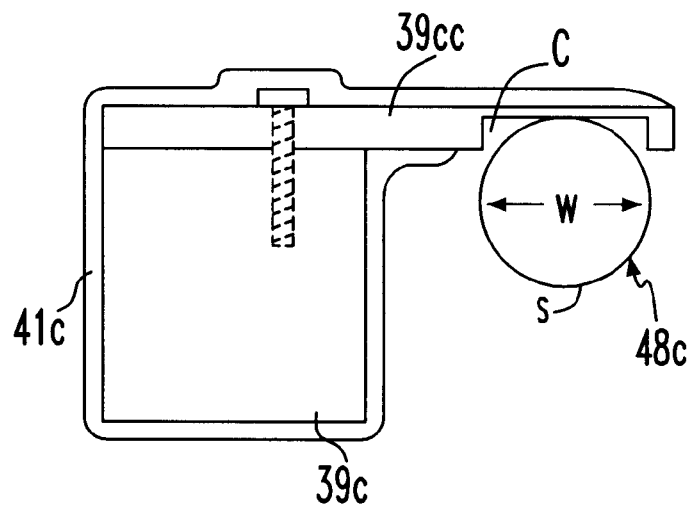
Figure 13D:
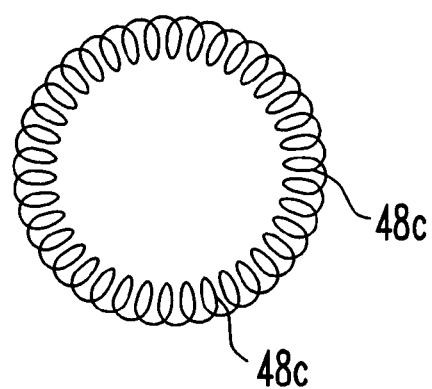

Referring now to FIGS. 12A–E, different configurations for the metal mesh thief are briefly described. FIG. 12A illustrates the use of a metal mesh thief electrode 40 supported upon suitable supports 96 within electrolyte bath 20 and further being parallel and co-planar with workpiece 16. FIG. 12B illustrates the use of metal mesh thief electrode 40 in a parallel and out-of-plane (i.e., non-co-planar) arrangement, further wherein the metal mesh 40 acts as a mesh-psuedo shield and thief electrode. FIG. 12C illustrates a parallel and out-of-plane configuration use of the metal mesh thief 40. FIG. 12D illustrates a parallel-perpendicular arrangement of the metal mesh thief. FIG. 12E illustrates the metal mesh thief 40 in a cylindrical arrangement, wherein the workpiece or wafer 16 may be placed above or below an upper edge and within a center region of the cylindrical shaped mesh. In the FIGS. 12A–E, the metal mesh thief electrode provides a liquid gap 64 and flow through openings in the mesh. Use of the metal mesh provides an improved control of electroplating film uniformity in the plating of a metal upon workpiece 16. Furthermore, metal mesh thief 40 provides uniformity control without adversely affecting a fluid flow path within the electroplating bath. In other words, the liquid flow path within the electroplating bath is benefited. In addition, in the illustration of FIG. 12D, the mesh thief 40 includes an elbow region (i.e., a right angle region) proximate the workpiece 16. The elbow region provides a greater uniformity effectiveness in that region, wherein the elbow increases an area of the mesh proximate the workpiece for more effectively removing ions in that region. Note also that the thief may be adjustably positioned or moved up or down as illustrated by the arrows in FIGS. 12A–D, for adjusting to a desired uniformity effectiveness.

The present invention provides an extended cathode lifetime and the simplification of workpiece loading and unloading. In addition, the present invention improves a productivity of a given electrodeposition process. The present invention further allows for the incorporation of the thief in cup platers with rotating or stationary heads.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention as limited solely by the appended claims.

What is claimed is:

1. A fixture for supporting a workpiece during electroplating of a metal upon the workpiece in a conductive electroplating bath, said fixture comprising:

a non-conductive frame member for receiving the workpiece therein;

current distribution means having at least a plurality of contacts with curved contact surfaces; disposed inwardly for providing an equally distributed electrical contact with an outer perimeter region of the workpiece, the workpiece being supported between said frame member and said current distribution means; and a thief electrode perimetrically disposed about the workpiece and spaced a prescribed distance from the workpiece by a gap region, wherein during plating of a metal upon the workpiece, the gap region between said thief and the workpiece is filled with the conductive electroplating bath.

2. The fixture according to claim 1, wherein said frame member includes a base member and a workpiece support member, the base member having a workpiece aperture therein, the workpiece aperture having a principal axis and extending from a back side to a front side, the workpiece aperture further having a dimension larger than the size of the workpiece, the support member having a dimension on the order of the workpiece, further wherein said frame member includes means for securing the workpiece support member inside the workpiece aperture in a prescribed position between said current distribution means and the support member.

3. The fixture according to claim 2, wherein the support member further includes a base having a flexible gasket material on a top surface thereof, the flexible gasket material providing an even distribution of forces upon the workpiece when the support member is secured in the prescribed position inside the workpiece aperture.

4. The fixture according to claim 3, wherein the base member of said frame member includes one of the following selected from the group consisting of polyvinylidene fluoride (PVDF), polypropylene, and PVC;

the base of the support member includes one of the following selected from the group consisting of PVDF, polypropylene, and PVC; and the flexible gasket material includes a stiff foam elastomeric material.

5. The fixture according to claim 2, wherein the base member includes equally spaced locking slots in the back side thereof proximate the periphery of the workpiece aperture, the workpiece support member includes corresponding locking slots in the back side proximate an outer periphery thereof, and said means for securing the workpiece support member inside the workpiece aperture in a prescribed position includes adjustable positioning locking tabs disposed between the locking slots in the base member and the corresponding locking slots in the workpiece support member.

6. The fixture according to claim 2, wherein said thief electrode includes an aperture disposed therein, said thief electrode being mounted upon said frame member, wherein the aperture of said thief electrode is larger than and concentric with the workpiece aperture of said frame member, the aperture of said thief electrode defining an outer periphery of the gap region.

7. The fixture according to claim 6, wherein said thief electrode includes one of the following selected from the group consisting of a stainless steel plate, a titanium plate, and a metal mesh.

8. The fixture according to claim 6, further comprising a non-conductive rim coating disposed on said thief electrode in a region about a rim of the thief electrode aperture and at an outer periphery of the gap region, the rim coating for modifying an effective plating starting point on said thief electrode to be distal, in a direction away from the workpiece and the outer periphery of the gap region, while a physical edge of said thief electrode remains proximate the workpiece.

9. The fixture according to claim 8, wherein the rim coating is disposed on a top surface of said thief electrode about the thief electrode aperture and on an inner perimeter region thereof.

10. The fixture according to claim 8, wherein the rim coating includes a polymer material.

11. The fixture according to claim 1, wherein said current distribution means includes a conductive ring portion, wherein the plurality of contacts includes a plurality of equally spaced apart contacts disposed on the conductive ring portion, the contacts extending inwardly and in a direction towards the bottom surface of the conductive ring portion.

12. The fixture according to claim 11, wherein the plurality of equally spaced apart contacts include one of the following selected from the group consisting of copper, beryllium copper, titanium and stainless steel leaf springs.

13. The fixture according to claim 11, wherein the plurality of equally spaced apart contacts includes a plurality of electrically conductive turns disposed along a circumference of the conductive ring portion, each turn providing at least one gently curved contact surface along a width dimension thereof for contacting the workpiece.

14. The fixture according to claim 11, wherein said current distribution means further includes an insulative coating disposed thereon, wherein electrical contact areas of the contacts are not covered by the insulative coating.

15. The fixture according to claim 1, wherein the gap region has a width in the range of three to seven millimeters.

16. The fixture according to claim 1, in combination with means for rotating said frame member and said current distribution means in unison about an axis, wherein said thief electrode is held in a stationary position with respect to said frame member and said current distribution means.

17. A electroplating apparatus having a fixture for supporting a workpiece during electroplating of a metal upon the workpiece in a conductive electroplating bath, said apparatus comprising:

a non-conductive frame member for receiving the workpiece therein;

current distribution means having at least a plurality of contacts with curved contact surfaces; disposed inwardly for providing an equally distributed electrical contact with an outer perimeter region of the workpiece, the workpiece being supported between said frame member and said current distribution means; and a thief electrode perimetrically disposed about the workpiece and spaced a prescribed distance from the workpiece by a gap region, wherein during plating of a metal upon the workpiece, the gap region between said thief and the workpiece is filled with the conductive electroplating bath.

18. The apparatus according to claim 17, wherein said frame member includes a base member and a workpiece support member, the base member having a workpiece aperture therein, the workpiece aperture having a principal axis and extending from a back side to a front side, the workpiece aperture further having a dimension larger than the size of the workpiece, the support member having a dimension on the order of the workpiece, further wherein said frame member includes means for securing the workpiece support member inside the workpiece aperture in a prescribed position between said current distribution means and the support member.

19. The apparatus according to claim 18, wherein the support member further includes a base having a flexible gasket material on a top surface thereof, the flexible gasket material providing an even distribution of forces upon the workpiece when the support member is secured in the prescribed position inside the workpiece aperture.

20. The apparatus according to claim 19, wherein the base member of said frame member includes one of the following selected from the group consisting of polyvinylidene fluoride (PVDF), polypropylene, and PVC;

the base of the support member includes one of the following selected from the group consisting of PVDF, polypropylene, and PVC; and the flexible gasket material includes a stiff foam elastomeric material.

21. The apparatus according to claim 18, wherein the base member includes equally spaced locking slots in the back side thereof proximate the periphery of the workpiece aperture, the workpiece support member includes corresponding locking slots in the back side proximate an outer periphery thereof, and said means for securing the workpiece support member inside the workpiece aperture in a prescribed position includes adjustable positioning locking tabs disposed between the locking slots in the base member and the corresponding locking slots in the workpiece support member.

22. The apparatus according to claim 18, wherein said thief electrode includes a metal plate having an aperture disposed therein, said thief electrode being mounted upon said frame member, wherein the aperture of said thief electrode is larger than and concentric with the workpiece aperture of said frame member, the aperture of said thief electrode defining an outer periphery of the gap region.

23. The apparatus according to claim 22, wherein said thief electrode includes one of the following selected from the group consisting of a stainless steel plate and a titanium plate, and a metal mesh.

24. The apparatus according to claim 22, further comprising a non-conductive rim coating disposed on said thief electrode in a region about a rim of the thief electrode aperture and at an outer periphery of the gap region, the rim coating for modifying an effective plating starting point on said thief electrode to be distal, in a direction away from the workpiece and the outer periphery of the gap region, while a physical edge of said thief electrode remains proximate the workpiece.

25. The apparatus according to claim 24, wherein the rim coating is disposed on a top surface of said thief electrode about the thief electrode aperture and on an inner perimeter region thereof.

26. The apparatus according to claim 24, wherein the rim coating includes a polymer material.

27. The apparatus according to claim 17, wherein said current distribution means includes a solid conductive ring portion, wherein the plurality of contacts includes a plurality of equally spaced apart contacts disposed on an extension of the conductive ring portion, the contacts extending in a direction towards a bottom surface of the conductive ring portion.

28. The apparatus according to claim 27, wherein the plurality of equally spaced apart contacts include one of the following selected from the group consisting of copper, beryllium copper, titanium and stainless steel leaf springs.

29. The apparatus according to claim 27, wherein the plurality of equally spaced apart contacts includes a plurality of electrically conductive turns disposed along a circumference of the extension, each turn providing at least one gently curved contact surface along a width dimension thereof for contacting the workpiece.

30. The apparatus according to claim 27, wherein said current distribution means further includes an insulative coating disposed thereon, wherein electrical contact areas of the contacts are not covered by the insulative coating.

31. The apparatus according to claim 17, wherein the gap region has a width in the range of three to seven millimeters.

32. The apparatus according to claim 17, further comprising:

means for rotating said frame member and said current distribution means in unison about an axis, wherein said thief electrode is held in a stationary position with respect to said frame member and said current distribution means.

33. A method for supporting a workpiece during electroplating of a metal upon the workpiece in a conductive electroplating bath, said method comprising the steps of:

providing a non-conductive frame member for receiving the workpiece therein;

providing a current distribution ring having at least a plurality of contacts with curved contact surfaces; disposed inwardly for providing an equally distributed electrical contact with an outer perimeter region of the workpiece, the workpiece being supported between the frame member and the current distribution ring; and disposing a thief electrode perimetrically about the workpiece and spaced a prescribed distance from the workpiece by a gap region, wherein during plating of a metal upon the workpiece, the gap region between the thief and the workpiece is filled with the conductive electroplating bath.

34. The method according to claim 33, wherein the frame member includes a base member and a workpiece support member, the base member having a workpiece aperture therein, the workpiece aperture having a principal axis and extending from a back side to a front side, the workpiece aperture further having a dimension larger than the size of the workpiece, the support member having a dimension on the order of the workpiece, further wherein the workpiece support member is secured inside the workpiece aperture in a prescribed position between the current distribution ring and the support member.

35. The method according to claim 34, wherein the support member further includes a base having a flexible gasket material on a top surface thereof, the flexible gasket material providing an even distribution of forces upon the workpiece when the support member is secured in the prescribed position inside the workpiece aperture.

36. The method according to claim 35, wherein the base member of the frame member includes one of the following selected from the group consisting of polyvinylidene fluoride (PVDF), polypropylene, and PVC;

the base of the support member includes one of the following selected from the group consisting of PVDF, polypropylene, and PVC; and the flexible gasket material includes a stiff foam elastomeric material.

37. The method according to claim 34, wherein the base member includes equally spaced locking slots in the back side thereof proximate the periphery of the workpiece aperture, the workpiece support member includes corresponding locking slots in the back side proximate an outer periphery thereof, and wherein the workpiece support member is secured inside the workpiece aperture in a prescribed position using adjustable positioning locking tabs disposed between the locking slots in the base member and the corresponding locking slots in the workpiece support member.

38. The method according to claim 34, wherein the thief electrode includes a metal plate having an aperture disposed therein, the thief electrode being mounted upon the frame member, wherein the aperture of the thief electrode is larger than and concentric with the workpiece aperture of the frame member, the aperture of the thief electrode defining an outer periphery of the gap region.

39. The method according to claim 38, wherein the thief electrode includes one of the following selected from the group consisting of a stainless steel plate, a titanium plate, and a metal mesh.

40. The method according to claim 38, further comprising a non-conductive rim coating disposed on the thief electrode in a region about a rim of the thief electrode aperture and at an outer periphery of the gap region, the rim coating for modifying an effective plating starting point on the thief electrode to be distal, in a direction away from the workpiece and the outer periphery of the gap region, while a physical edge of the thief electrode remains proximate the workpiece.

41. The method according to claim 40, wherein the rim coating is disposed on a top surface of the thief electrode about the thief electrode aperture and on an inner perimeter region thereof.

42. The method according to claim 40, wherein the rim coating includes a polymer material.

43. The method according to claim 33, wherein the current distribution ring includes a solid conductive ring portion, wherein the plurality of contacts includes a plurality of equally spaced apart contacts disposed on an extension of the conductive ring portion, the contacts extending in a direction towards a bottom surface of the conductive ring portion.

44. The method according to claim 43, wherein the plurality of equally spaced apart contacts include one of the following selected from the group consisting of copper, beryllium copper, titanium and stainless steel leaf springs.

45. The method according to claim 43, wherein the plurality of equally spaced apart contacts includes a plurality of electrically conductive turns disposed in a channel formed by the extension, each turn providing at least one gently curved contact surface along a width dimension thereof for contacting the workpiece.

46. The method according to claim 43, wherein the current distribution ring further includes an insulative coating disposed thereon, wherein electrical contact areas of the contacts are not covered by the insulative coating.

47. The method according to claim 33, wherein the gap region has a width in the range of three to seven millimeters.

48. The method according to claim 33, further comprising the step of:

rotating the frame member and the current distribution means in unison about an axis, wherein the thief electrode is held in a stationary position with respect to the frame member and the current distribution ring.

49. The method according to claim 33, wherein each of said plurality of contacts includes alpha-tantalum.

50. The method according to claim 33, wherein each of said plurality of contacts includes a metallic material disposed on an elastomeric material.

51. The method according to claim 33, wherein said plurality of contacts comprises a plurality of continuous spiral-wound wire turns disposed in a channel formed by said current distribution ring.

* * * * *

UNITED STATES PATENT AND TRADEMARK OFFICE
CERTIFICATE OF CORRECTION

PATENT NO. : 6,071,388
DATED : Jun. 6, 2000
INVENTOR(S) : Cyprian E. Uzoh

It is certified that error appears in the above-identified patent and that said Letters Patent are hereby corrected as shown below:

In claim 1, column 13, line 2, after the word "surfaces" delete ";" (semicolon);
In claim 17, column 14, line 54, after the word "surfaces" delete ";" (semicolon);
In claim 33, column 16, line 44, after the word "surfaces" delete ";" (semicolon).

Signed and Sealed this

First Day of May, 2001

Attest:

NICHOLAS P. GODICI

*Attesting Officer*   *Acting Director of the United States Patent and Trademark Office*

UNITED STATES PATENT AND TRADEMARK OFFICE
CERTIFICATE OF CORRECTION

PATENT NO.  : 6,071,388
DATED       : Jun. 6, 2000
INVENTOR(S) : Shigeki Sakai, Shingi Migita It is certified that error appears in the above-identified patent and that said Letters Patent are hereby corrected as shown below:

Col. 1, line 8, change "fereinto" to --hereinto--

Signed and Sealed this

Twenty-ninth Day of May, 2001

Attest:

NICHOLAS P. GODICI

*Attesting Officer*        *Acting Director of the United States Patent and Trademark Office*

UNITED STATES PATENT AND TRADEMARK OFFICE
CERTIFICATE OF CORRECTION

PATENT NO. : 6,071,388
DATED : June 6, 2000
INVENTOR(S) : Shigeki Sakai and Shingi Migita It is certified that error appears in the above-identified patent and that said Letters Patent is hereby corrected as shown below:

<u>Column 1,</u>
Line 8, change "fereinto" to -- hereinto --

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,071,388
DATED : June 6, 2000
INVENTOR(S) : Cyprian E. Uzoh

It is certified that error appears in the above-identified patent and that said Letters Patent is hereby corrected as shown below:

This certificate supersedes Certificate of Correction issued May 11, 2004, the number was erroneously mentioned and should be vacated since no Certificate of Correction was granted.

Signed and Sealed this

Twenty-second Day of June, 2004

JON W. DUDAS
*Acting Director of the United States Patent and Trademark Office*